United States Patent
Hasegawa et al.

(10) Patent No.: US 12,409,461 B2
(45) Date of Patent: Sep. 9, 2025

(54) DUST COLLECTOR AND DUST COLLECTION METHOD

(71) Applicant: Creative Technology Corporation, Kanagawa (JP)

(72) Inventors: Takaaki Hasegawa, Kawasaki Kanagawa (JP); Hiroyuki Moriyama, Kawasaki Kanagawa (JP)

(73) Assignee: Creative Technology Corporation, Kanagawa (JP)

( * ) Notice: Subject to any disclaimer, the term of this patent is extended or adjusted under 35 U.S.C. 154(b) by 0 days.

(21) Appl. No.: 17/768,465

(22) PCT Filed: Aug. 31, 2021

(86) PCT No.: PCT/JP2021/031967
§ 371 (c)(1),
(2) Date: Apr. 12, 2022

(87) PCT Pub. No.: WO2022/064977
PCT Pub. Date: Mar. 31, 2022

(65) Prior Publication Data
US 2023/0381791 A1    Nov. 30, 2023

(30) Foreign Application Priority Data
Sep. 24, 2020  (JP) .................. 2020-159465

(51) Int. Cl.
*B01D 53/22* (2006.01)
*B03C 3/47* (2006.01)
(Continued)

(52) U.S. Cl.
CPC .................. *B03C 3/70* (2013.01); *B03C 3/47* (2013.01); *B03C 3/64* (2013.01)

(58) Field of Classification Search
CPC ................ B03C 3/70; B03C 3/47; B03C 3/64
See application file for complete search history.

(56) References Cited

U.S. PATENT DOCUMENTS 2,864,460 A * 12/1958 Powers .................. B03C 3/155
55/DIG. 1
2,917,130 A * 12/1959 Powers .............. B01D 46/0032
96/67
(Continued)

FOREIGN PATENT DOCUMENTS

CN    106268085 A * 1/2017 .......... B01D 46/023
JP    H09-262500 A    10/1997
(Continued)

OTHER PUBLICATIONS

"Planar view" American Heritage Dictionary of the English Language, Fifth Edition. 1 page. 2016 by Houghton Mifflin Harcourt Publishing Company <https://www.thefreedictionary.com/planar> (Year: 2016).*

(Continued)

*Primary Examiner* — Anthony R Shumate
(74) *Attorney, Agent, or Firm* — Kim & Stewart LLP

(57) ABSTRACT

Provides a dust collector capable of being installed even in small spaces and capable of collecting dust efficiently. A dust collector 1 includes a first electrode layer 12 formed of a conductor, a second electrode layer 14 formed of a conductor, having sufficient size to cover the first electrode layer 12 in planar view, having lacking parts (through holes 14H, slits 14S) piercing therethrough in a thickness direction, having sufficient size to cover the first electrode layer 12 in planar view, and placed interfacing the first electrode layer 12, and an insulating layer (a first insulating layer 13, a second insulating layer 15) formed of an insulative material, insulating the first electrode layer 12 and the second electrode layer 14, and forming a single merged layer structure with the first electrode layer 12 and the second electrode layer 14.

9 Claims, 3 Drawing Sheets

(51) Int. Cl.
    *B03C 3/64*     (2006.01)
    *B03C 3/70*     (2006.01)

(56) References Cited

U.S. PATENT DOCUMENTS

| | | | | |
|---|---|---|---|---|
| 4,750,921 | A | * | 6/1988 | Sugita ............ B03C 3/155 96/67 |
| 4,798,575 | A | * | 1/1989 | Siversson ......... B65H 45/20 493/347 |
| 5,234,772 | A | * | 8/1993 | Oguchi ............ G02B 6/12007 428/473.5 |
| 10,357,781 | B2 | | 7/2019 | Luo |
| 2004/0216745 | A1 | * | 11/2004 | Yuen ............... A62B 19/00 128/205.27 |
| 2006/0000197 | A1 | * | 1/2006 | Haefner ........... B01D 46/521 55/521 |
| 2007/0223173 | A1 | | 9/2007 | Fujisawa et al. |
| 2008/0047434 | A1 | | 2/2008 | Kobayashi et al. |
| 2008/0251718 | A1 | | 10/2008 | Kaga et al. |
| 2008/0276805 | A1 | * | 11/2008 | Lotgerink-Bruinenberg ......... B60H 3/0658 96/75 |
| 2012/0074316 | A1 | | 3/2012 | Watanabe et al. |
| 2012/0120545 | A1 | | 5/2012 | Fujisawa et al. |
| 2016/0207051 | A1 | | 7/2016 | Tatsumi et al. |
| 2017/0120181 | A1 | * | 5/2017 | Jeon ................ F24F 13/20 |
| 2018/0226392 | A1 | * | 8/2018 | Lee ................. H01L 23/60 |
| 2020/0096881 | A1 | | 3/2020 | Van Duivenbode et al. |

FOREIGN PATENT DOCUMENTS

| | | |
|---|---|---|
| JP | 2001-179128 A | 7/2001 |
| JP | 2004-298660 A | 10/2004 |
| JP | 2009-004161 A | 1/2009 |
| JP | 2012-064567 A | 3/2012 |
| JP | 5500172 B2 | 5/2014 |
| JP | 6620994 B2 | 12/2019 |
| JP | 2020-522020 A | 7/2020 |
| KR | 20180104207 A | 9/2018 |
| WO | 2005/091356 A1 | 9/2005 |
| WO | 2015-029698 A1 | 3/2015 |

OTHER PUBLICATIONS

"Layer" American Heritage Dictionary of the English Language, Fifth Edition. 1 page. 2016 by Houghton Mifflin Harcourt Publishing Company. <https://www.thefreedictionary.com/layer> (Year: 2016).*
"Electric fields—Forces on charged particles—Higher Physics Revision—BBC Bitesize" https://www.bbc.co.uk/bitesize/guides/zyfyyrd/revision/2#:~:text=In%20an%20electric%20field%20a,it%20will%20push%20them%20apart. retrieved 2024, 5 pages (Year: 2024).*
Machine translation of Dae K S CN-106268085-A Jan. 4, 2017 (Year: 2017).*
"Slit", American Heritage Dictionary of the English Language, Fifth Edition. 2016 by Houghton Mifflin Harcourt Publishing Company. 1 page https://www.thefreedictionary.com/slit (Year: 2016).*
Translation of the International Search Report mailed Nov. 2, 2021 in International Application No. PCT/JP2021/031967, 14 pages.

* cited by examiner

DUST COLLECTOR AND DUST COLLECTION METHOD

TECHNICAL FIELD

The present invention relates to a dust collector and a dust collection method.

BACKGROUND TECHNOLOGY

For example, fine dust (particles) generated within or near manufacturing equipment such as in semiconductor device fabrication tools is often problematic, contributing to contamination defects on the processed workpiece. Therefore, there exists a need to reduce particles and maintain cleanliness near the workpiece, within or in the vicinity surrounding the manufacturing equipment.

Regarding this conception, methods such as a filter dust collection system, an electric dust collection system, and an electric-field curtain system have been previously proposed.

In the filter dust collection system, dispersed airborne particles are drawn via an air duct, and the air is purified by the air filter. Consequently, it is not possible to collect particles prior to its dispersal, and the high pressure drop yields to a low dust collection efficiency.

In the electric dust collection system, particles are charged through a corona discharge by an ionizer, and the charged particles are collected to its opposing-charged bipolar electrode. Accordingly, installation locations of the collection system are restricted due to the ionization of the peripheral environment and the enlarged footprint.

A dust collection device having no ionizer (for example, Patent Literature 1) has been also proposed; however, since air must pass between the bipolar electrode structure, space saving has its limitations.

In the electric-field curtain system, unbalanced electric fields, traveling in a single direction are generated by applying alternating current to polyphase linear electrodes buried in a dielectric. Then, charged particles are caused to float and is pushed towards the direction to be collected. Likewise, due to its large size, installation locations of the collection system are restricted.

CITATION LIST

Patent Literature

PTL 1: Japanese Patent No. 6620994

SUMMARY OF INVENTION

Technical Problem

From above observations, a dust collector and a dust collection method are demanded of which can be installed even in small spaces and efficiently collect dust.

Solution to Problem

The present invention provides a dust collector including a first electrode layer consisted by a conductor, a second electrode layer consisted by a conductor, of which having lacking parts therethrough in the thickness direction, having sufficient size to cover the first electrode layer in planar view, constructed to interface the first electrode layer, and an insulating layer consisting of an insulative material, insulating the first electrode layer and the second electrode layer, forming a single merged layer structure with the first electrode layer and the second electrode layer.

Advantageous Effects of Invention

According to the present invention, it is possible to provide a dust collector and a dust collection method that can be installed even in small spaces of which can collect dust efficiently.

DESCRIPTION OF EMBODIMENTS

Hereinafter, a dust collector according to an embodiment of the present invention will be explained in detail.

Figure 1:
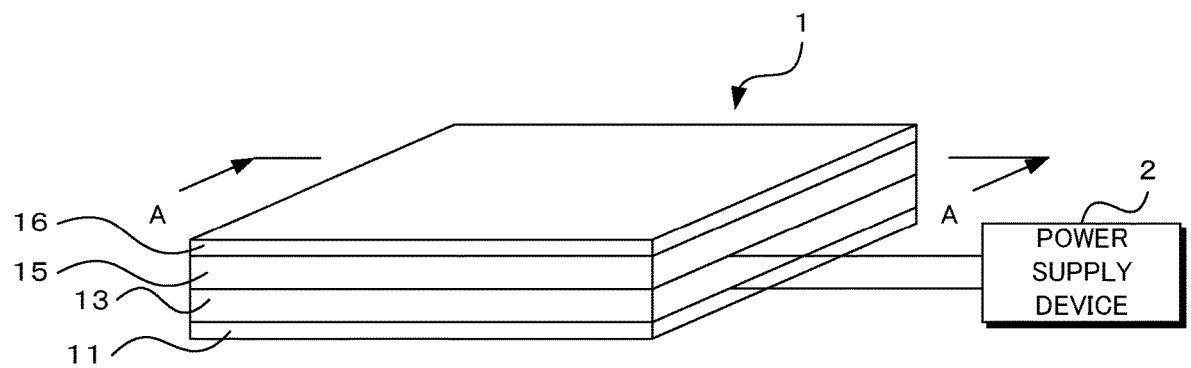
FIG. 1 is an external perspective view of the dust collector.
Figure 2:
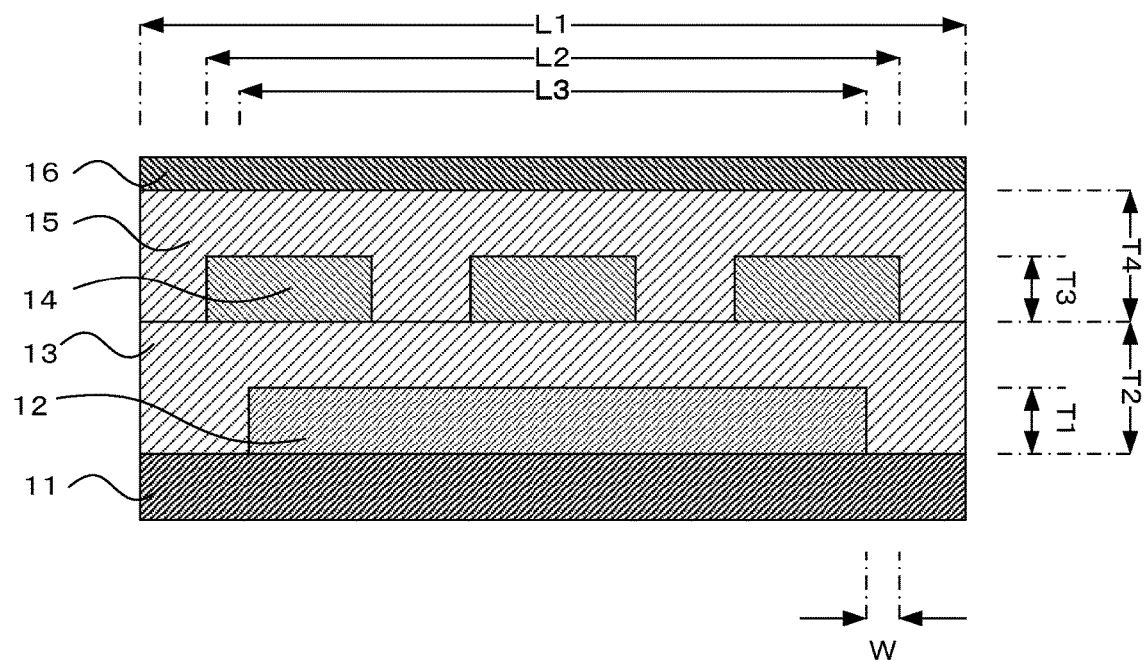
FIG. 2 is a cross-sectional view of the dust collector taken along A-A line in FIG. 1.
Figure 3:
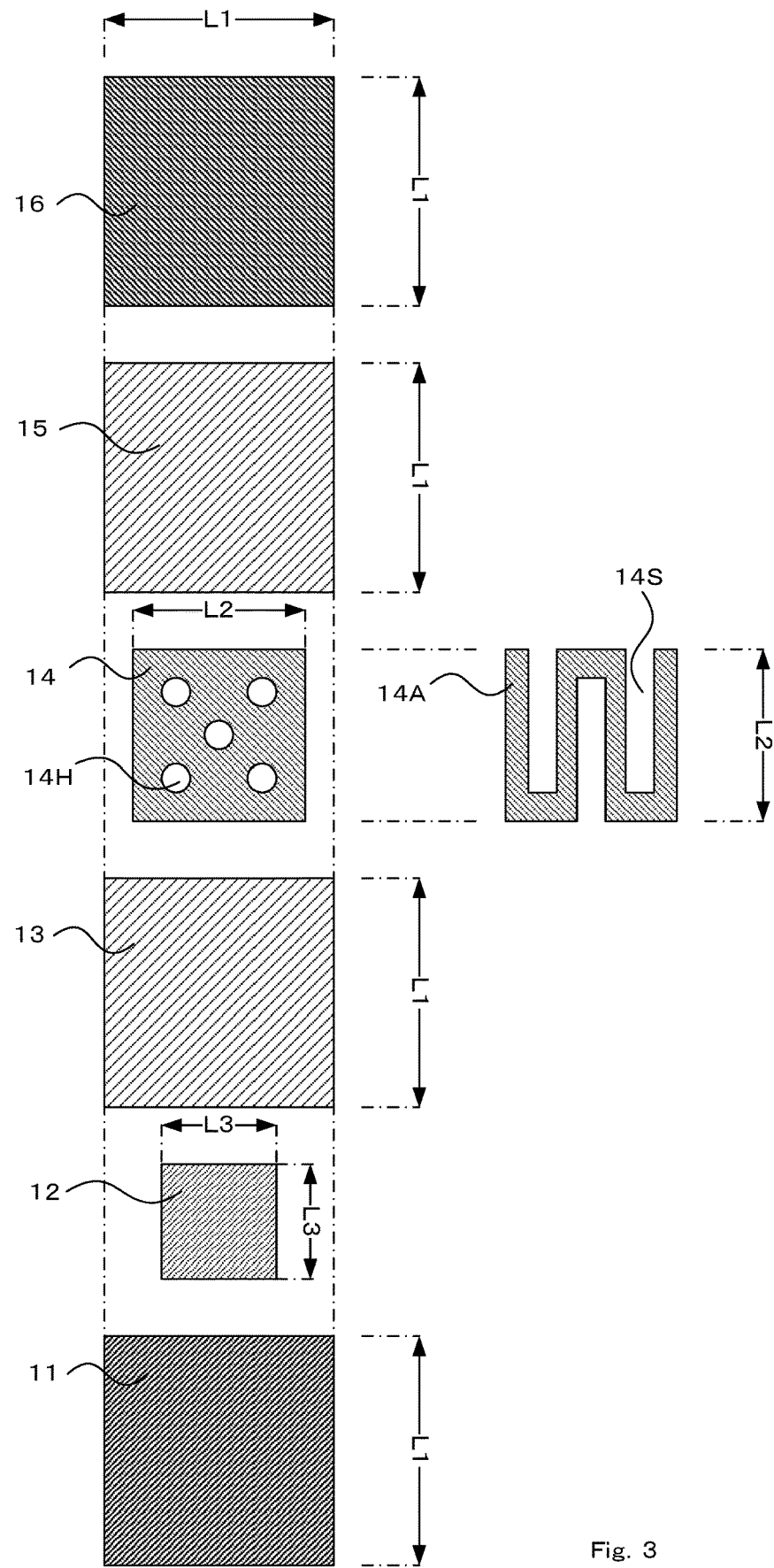
FIG. 3 is a planar view of respective layers of the dust collector.

FIG. 1 is an external perspective view of a dust collector 1 according to the embodiment, FIG. 2 is a cross-sectional view of the dust collector 1 taken along A-A line in FIG. 1, and FIG. 3 is a planar view of respective layers of the dust collector 1.

As shown in FIG. 1 and FIG. 2, the dust collector 1 includes a support base layer 11, a first electrode layer 12, a first insulating layer 13, a second electrode layer 14, a second insulating layer 15, and a dust attraction layer 16.

A power supply device 2 is connected to the first electrode layer 12 and the second electrode layer 14.

The support base layer 11 is a layer formed of an insulator, more preferably an insulative synthetic resin.

The first electrode layer 12 is a layer formed of a conductor. Examples of the conductor include a gold leaf, a conductive synthetic resin, and carbon. The first electrode layer is provided on one surface of the support base layer 11.

The first insulating layer 13 is a layer formed of an insulator, more preferably an insulative synthetic resin not interfering with an electric field. Examples of the insulative synthetic resin not interfering with electric field include polyimide. The first insulating layer 13 is provided on a side of the support base layer 11 where the first electrode layer 12 is provided and surrounds the first electrode layer 12 with the support base layer 11 or alone surrounds the first electrode layer 12, for insulation.

The second electrode layer 14 is a layer formed of a conductor. Examples of the conductor include a gold leaf, a conductive synthetic resin, and carbon. The second electrode layer 14 is provided at a position where the second electrode layer 14 is opposed to the first electrode layer 12 with the first insulating layer 13 interposed therebetween. The second electrode layer 14 has lacking parts piercing therethrough in a thickness direction and has sufficient size to cover the first electrode layer 12 in planar view.

The second insulating layer 15 is a layer formed of an insulator, more preferably an insulative synthetic resin not interfering with an electric field. For example, polyimide can be cited as the insulative synthetic resin not interfering with the electric field. The second insulating layer 15 is placed at a position where the second insulating layer 15 is opposed to the first insulating layer 13 with the second electrode layer 14 interposed therebetween, and surrounds the second electrode layer 14 with the first insulating layer 13 or alone surrounds the second electrode layer 14, for insulation.

The dust attraction layer 16 is placed at a position where the dust attraction layer 16 is opposed to the second electrode layer 14 with the second insulating layer 15 interposed therebetween. The dust attraction layer 16 is formed of a material suitable for collecting fine dust (particles) and retaining them. An adhesive, a material with high intermolecular force or a material with high friction force can be suitably selected and adopted as the material for the dust attraction layer 16.

The dust collector 1 is formed as a layered sheet or a layered plate in which the support base layer 11, the first electrode layer 12, the first insulating layer 13, the second electrode layer 14, the second insulating layer 15, and the dust attraction layer 16 are stacked in this order.

The first insulating layer 13 and the second insulating layer 15 may be integrally formed. Moreover, the support base layer 11 may be integrally formed with the first insulating layer 13 and the second insulating layer 15 using the same material as the first insulating layer 13 and the second insulating layer 15.

As shown in FIG. 2 and FIG. 3, the dust collector 1 according to the embodiment can be formed to have, for example, a square shape in planar view. An example in which the dust collector 1 is formed to have the square shape will be explained below; however, the dust collector 1 may have other shapes.

The support base layer 11, the first insulating layer 13, the second insulating layer 15, and the dust attraction layer 16 are formed to have the approximately same square shape and size in planar view in which each side has a length L1.

The second electrode layer 14 is formed to have a square shape in which each side has a length L2 shorter than the length L1.

The first electrode layer 12 is formed to have a square shape in which each side has a length L3 shorter than the length L2.

Accordingly, the first electrode layer 12 fits within the second electrode layer 14, and the second electrode layer 14 fits within the support base layer 11, the first insulating layer 13, the second insulating layer 15, and the dust attraction layer 16 in planar view seen from the dust attraction layer 16 side.

As shown in FIG. 2, the first electrode layer 12 is formed so that edges of the first electrode layer 12 are located on an inner side by a width W or more from edges of the second electrode layer 14. The width W is desirably 5 mm or more.

A thickness T1 of the first electrode layer 12 is thinner than a thickness T2 of the first insulating layer 13. A thickness T3 of the second electrode layer 14 is thinner than a thickness T4 of the second insulating layer 15.

As shown in FIG. 3, each of the support base layer 11, the first electrode layer 12, the first insulating layer 13, the second insulating layer 15, and the dust attraction layer 16 is formed without having a lacking part in planar view, each with their own unique layer.

On the other hand, the second electrode layer 14 has circular through holes 14H at equal intervals and piercing therethrough in the thickness direction as lacking parts. An inner diameter of the through holes 14H is, for example, 5 mm to 15 mm, and an interval between adjacent through holes 14H is 10 mm to 30 mm.

A second electrode layer 14A according to a modification example of the second electrode layer 14 has slits 14S as lacking parts. The slits 14S are provided alternately from one side of the second electrode layer 14 toward a side opposed to the one side. Therefore, unevenness in dust collection performance can be prevented.

The lacking parts are provided so as not to interfere with energizing the second electrode layer 14.

Figure 4:
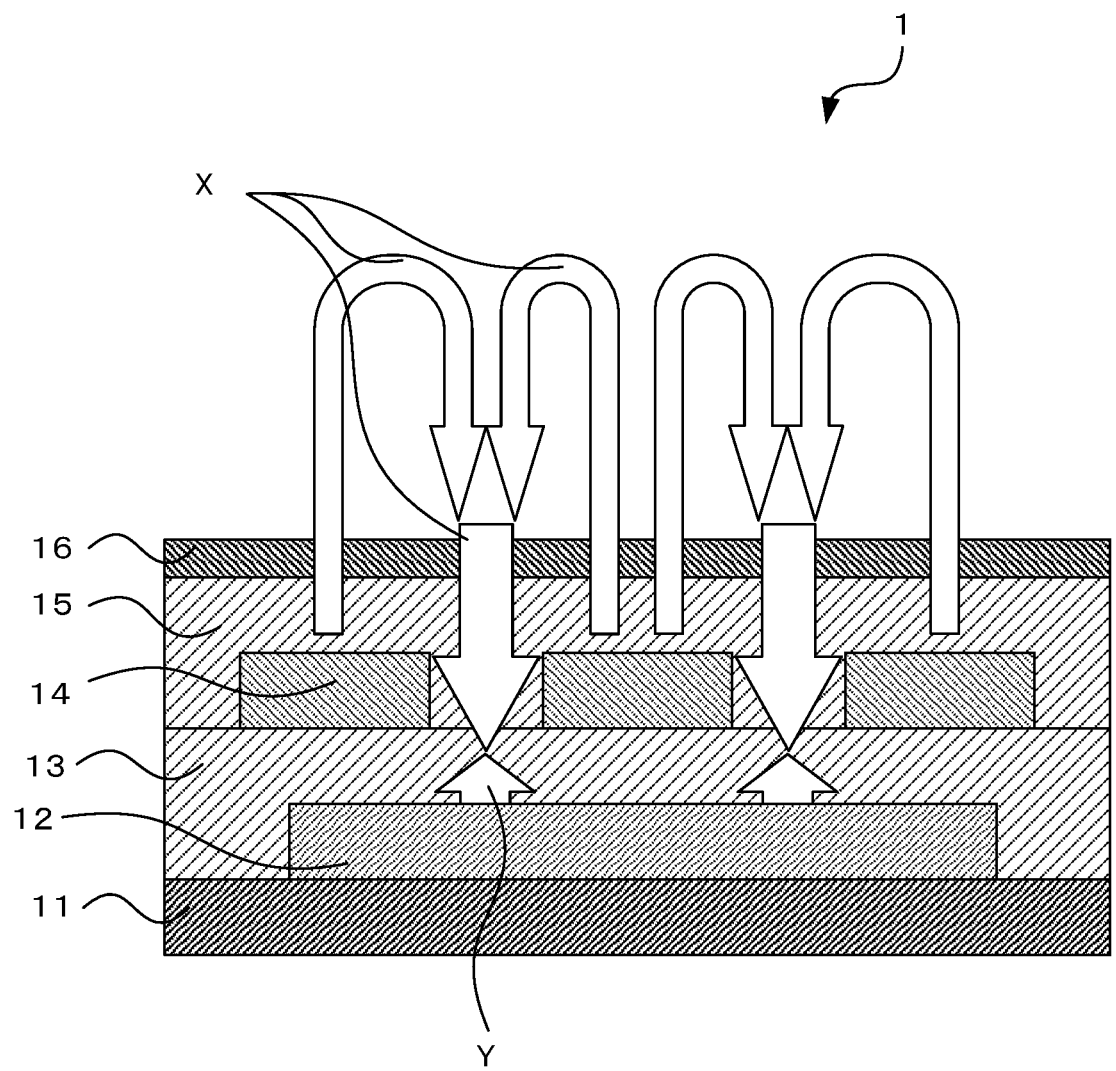
FIG. 4 is a cross-sectional view showing a state of electric fields generated in the dust collector.

FIG. 4 is a cross-sectional view showing a state of electric fields generated in the dust collector 1. In FIG. 4, outlined arrows X and outlined arrows Y indicate electric fields.

A positive terminal of the power supply device 2 is connected to one of the first electrode layer 12 and the second electrode layer 14, and a negative terminal thereof is connected to the other of them to energize.

In a case where particles consist of an insulating material, it is desirable that the second electrode layer 14 is connected to the opposite polarity of which the insulating material tends to be charged (triboelectric effect) from a dust collection efficiency perspective.

The electric field from the second electrode layer 14 passes the second insulating layer 15 and the dust attraction layer 16 from the second electrode layer 14 as shown by the arrows X, reaches a space where particles exist, passes the dust attraction layer 16 and the second insulating layer 15 again, and passes the first insulating layer 13 through the lacking parts of the second electrode layer 14 to reach a balanced part with respect to the electric field from the first electrode layer 12 shown by the arrows Y.

According to the above, an unbalanced electric field is generated in an outer side direction of the dust attraction layer 16 of the dust collector 1, and then, particles are repelled from a workpiece or the like by the electric field directed to an outer side and particles move along the electric field by the electric field directed to an inner side to be collected by the dust attraction layer 16. Here, the unbalanced electric field indicates a range excluding an offset point that serves as the balanced part due to cancellation of the electric fields and that has no directionality and refers to an electric field where Coulomb force having directionality is generated. In the embodiment, the first electrode layer 12 is arranged not at the same height position as the second electrode layer 14 in front view of FIG. 4 but lower than the first insulating layer 13 with the first insulating layer 13 interposed therebetween. Accordingly, the balanced part of the electric fields exists not at an upper end of the arrow X of FIG. 4 but at a position where the arrows X face the arrows Y, namely, at the inside of the dust collector 1; therefore, dust entering the electric field can be moved constantly in a fixed direction shown by the arrows X of FIG. 4 and collected to the dust attraction layer 16 provided on an upper end surface of the dust collector 1.

Here, the second electrode layer 14 covers the entire surface of the first electrode layer 12 in planar view. Accordingly, all orientations of the electric field from the second electrode layer 14 are aligned in the direction of the lacking parts, namely, the inner direction of the dust collector 1 in planar view; therefore, it is possible to prevent particles from scattering to the outer side of the dust collector 1.

Furthermore, in a case where particles are made of a conductor or some insulating material, the particles are charged inside the electric field due to electrostatic induction, and in a case where particles are made of an insulating material or a semiconductor, the particles are charged inside the electric field due to dielectric polarization. Particles are charged in both cases.

The charged particles are attracted by the electric field and collected by the dust attraction layer 16.

Here, experimental results will be explained. Experiments were made using the dust collector 1 according to the embodiment having 60 mm×60 mm.

A voltage of 2 kV was applied to the first electrode layer 12 of the dust collector 1 set up vertically to a floor surface, and a voltage of −4 kV which was a reverse-polarity voltage higher than the voltage applied to the first electrode layer 12 was applied to the second electrode layer 14.

Samples were hung by strings at intervals on the dust attraction layer 16 side of the dust collector 1.

In a sample of aluminum foil with 10 mm×0.5 mm, the attracting effect was confirmed within a distance of approximately 100 mm.

In a sample of a silicon wafer with 10 mm×0.5 mm, the attracting effect was confirmed within a distance of approximately 50 mm.

In a sample of resin (acrylic resin) with 10×0.5 mm, the attracting effect was confirmed within a distance of approximately 60 mm.

As described above, the dust collector 1 according to the embodiment includes the first electrode layer 12 formed of the conductor, the second electrode layer 14 formed of the conductor, having sufficient size to cover the first electrode layer 12 in planar view, having the lacking parts piercing therethrough in the thickness direction (the through holes 14H, the slits 14S) and arranged to be opposed to the first electrode layer 12, and the insulating layer (the first insulating layer 13, the second insulating layer 15) formed of the insulative material, insulating the first electrode layer 12 and the second electrode layer 14, and forming a single merged layer structure with the first electrode layer 12 and the second electrode layer 14.

A dust collection method according to the embodiment includes applying a voltage to the second electrode layer 14 that is arranged in layer so as to be opposed to the first electrode layer 12 with the insulating layer (the first insulating layer 13) interposed therebetween and that has sufficient size to cover the first electrode layer 12 in planar view, and applying a voltage to the first electrode layer 12, to thereby cause the electric field generated from the second electrode layer 14 toward the outer side direction to pass through the lacking parts (the through holes 14H, the slits 14S) provided in the second electrode layer 14, generating the unbalanced electric field reaching the first electrode layer 12, and conveying particles along the unbalanced electric field.

Accordingly, there is an advantage that a dust collector that can be installed even at a small space and that can collect dust can be provided according to the embodiment.

REFERENCE SIGNS LIST

1: Dust collector
2: Power supply device
11: Support base layer
12: First electrode layer
13: First insulating layer
14: Second electrode layer
14A: Second electrode layer
14H: Through hole
14S: Slit
15: Second insulating layer
16: Dust attraction layer

The invention claimed is:

1. A dust collector comprising:
a first electrode layer formed of a conductor;
a second electrode layer formed of a conductor, the second electrode layer having through holes penetrating the second electrode layer in a thickness direction, a size of the second electrode layer being larger than a size of the first electrode layer in planar view, and the second electrode layer being arranged to be opposed to the first electrode layer; and
an insulating layer formed of an insulative material, insulating the first electrode layer and the second electrode layer, and forming one layer structure with the first electrode layer and the second electrode layer.

2. The dust collector according to claim 1,
wherein the first electrode layer is formed so that edges of the first electrode layer are located on an inner side by 5 mm or more from edges of the second electrode layer.

3. The dust collector according to claim 1, further comprising:
a dust attraction layer arranged to be opposed to the second electrode layer with the insulating layer interposed therebetween.

4. The dust collector according to claim 1, further comprising:
a support base layer arranged to be opposed to the first electrode layer with the insulating layer interposed therebetween.

5. The dust collector according to claim 1,
wherein the through holes have a diameter of 5 mm to 15 mm, and
an interval between adjacent through holes is 10 mm to 30 mm.

6. The dust collector according to claim 1,
wherein the insulating layer is formed of polyimide.

7. A dust collection method comprising:
applying a voltage to a second electrode layer that is arranged in layers opposed to a first electrode layer with an insulating layer interposed between the first and second electrode layers, a size of the second electrode layer being larger than a size of the first electrode layer in planar view; and
applying a voltage to the first electrode layer, to thereby cause an electric field generated from the second electrode layer toward an outer side direction to pass through holes that penetrate the second electrode layer in a thickness direction, and reach the first electrode layer.

8. The dust collection method according to claim 7,
wherein particles are conveyed along the generated electric field.

9. The dust collector according to claim 1,
wherein each of the first and second electrode layers has a square shape.

* * * * *